United States Patent [19]
Bainbridge et al.

[11] Patent Number: 5,697,840
[45] Date of Patent: Dec. 16, 1997

[54] ELECTRONIC CABINET WITH VENT

[75] Inventors: Gary Dean Bainbridge, Township of Sparta, N.J.; Gary Michael Irwin, Omaha, Nebr.; Stephen John Palaszewski, Township of Chester, N.J.; Attila Sipos, Charlottesville, Va.; Raymond David Smolen, Totowa, N.J.

[73] Assignee: Lucent Technologies Inc., Murray Hill, N.J.

[21] Appl. No.: 570,423

[22] Filed: Dec. 11, 1995

[51] Int. Cl.[6] .................................................. H05K 7/20
[52] U.S. Cl. ........................... 454/184; 361/693; 361/695; 429/71
[58] Field of Search .............................. 361/693, 695; 429/71; 454/184

[56] References Cited

U.S. PATENT DOCUMENTS 5,140,744  8/1992  Miller .................................... 29/730
5,150,277  9/1992  Bainbridge et al. ................. 361/695
5,297,004  3/1994  Mazura ............................. 454/184 X
5,372,543  12/1994  Steele ................................ 454/184

FOREIGN PATENT DOCUMENTS 1-253997  10/1989  Japan .
1-286497  11/1989  Japan ................................. 361/695
2 061 599  5/1981  United Kingdom ................. 429/71

Primary Examiner—Harold Joyce

[57]  ABSTRACT

An electronics cabinet which provides venting of gases within a battery compartment and also protects the inside from wind driven rain and other particles. A cover assembly is provided over the compartment of the cabinet, which assembly includes a cover member with a plurality of louvers and a blocking plate covering the louvers. A fan is mounted in the compartment in order to circulate air within the compartment so as to enhance the venting capability.

7 Claims, 4 Drawing Sheets

ELECTRONIC CABINET WITH VENT

FIELD OF THE INVENTION

This invention relates to outdoor cabinets housing electronic equipment.

BACKGROUND OF THE INVENTION

In telecommunications systems, such as Subscriber Loop Carrier (SLC®) or Hybrid Fiber Coax (HFC™) Systems, some electronic equipment must be housed outdoors in the vicinity of a plurality of subscribers. These cabinets typically include a compartment which houses batteries for back-up power to the equipment. Such compartments need to be properly vented to avoid the buildup of gases, such as hydrogen, which would cause an explosive reaction. Consequently, vents are desirably included on the compartment cover to permit escape of the gases. However, the presence of such vents also means that, in the event of storms having high winds (typically greater than 40 mph), it is possible that water can enter the compartment, contaminate the area, and possibly short the batteries.

Consequently, it is desired to provide a cabinet with at least a portion which will both afford venting of undesirable gases and prevent entry of water therein.

SUMMARY OF THE INVENTION

The invention is a cabinet for housing electronic equipment. The cabinet includes a battery compartment and a cover member coveting the battery compartment. The cover member includes a plurality of louvers on a portion thereof. A fan is mounted within the compartment to circulate air therein. A plate is mounted over the portion of the cover member including the louvers to form a gap between the plate and cover member.

BRIEF DESCRIPTION OF THE FIGURES

These and other features are delineated in detail in the following description. In the drawing.

It will be appreciated that, for purposes of illustration, these figures are not necessarily drawn to scale.

DETAILED DESCRIPTION

Figure 1:
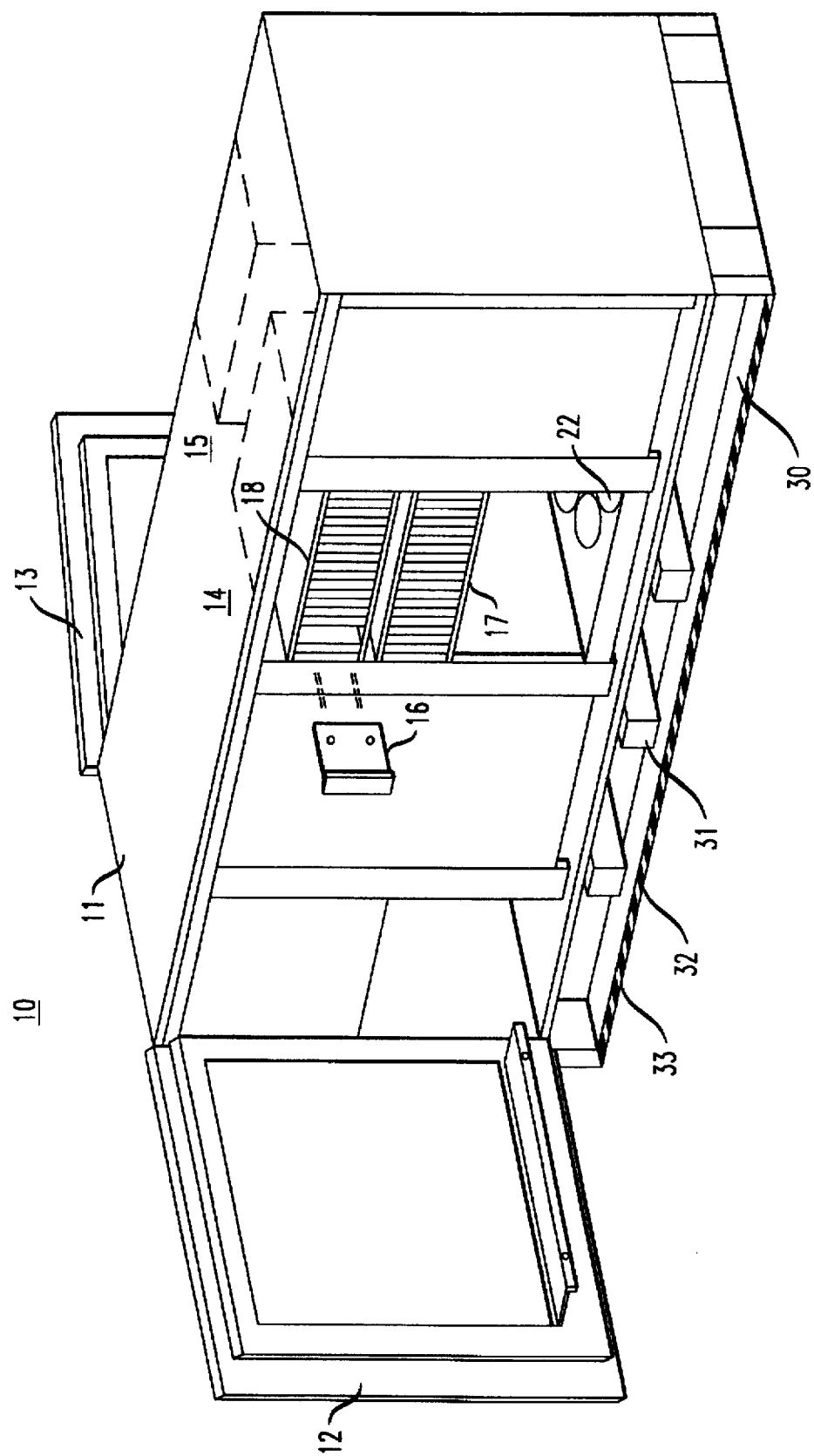
FIG. 1 is a perspective view of a cabinet which can incorporate the invention.

Referring now to the drawings, in which like reference numerals identify similar or identical elements, FIG. 1 illustrates a typical cabinet, 10, for housing electronic equipment in a telecommunications system. The cabinet, 10, includes an upper portion, 11, which encloses equipment such as circuit packs, e.g., 16, mounted within shelves, e.g., 17 and 18, to form banks, 14 and 15. The upper portion, 11, also typically includes cooling means such as a fan, 22, and other electronic equipment, such as multiplexers and/or digital loop carrier equipment (not shown). Doors, 12 and 13, are mounted on opposite sides of the upper portion to protect and provide access to the banks, 14 and 15. (Doors which would usually be mounted on the opposite end of the cabinet (right-hand side in FIG. 1) are not shown for purposes of illustrating the cabinet.)

At the bottom of the cabinet is a compartment, 30, which is used to house the batteries, e.g., 31, which power the electronic equipment. FIG. 1 illustrates the compartment, 30, with the cover removed.

Figure 2:
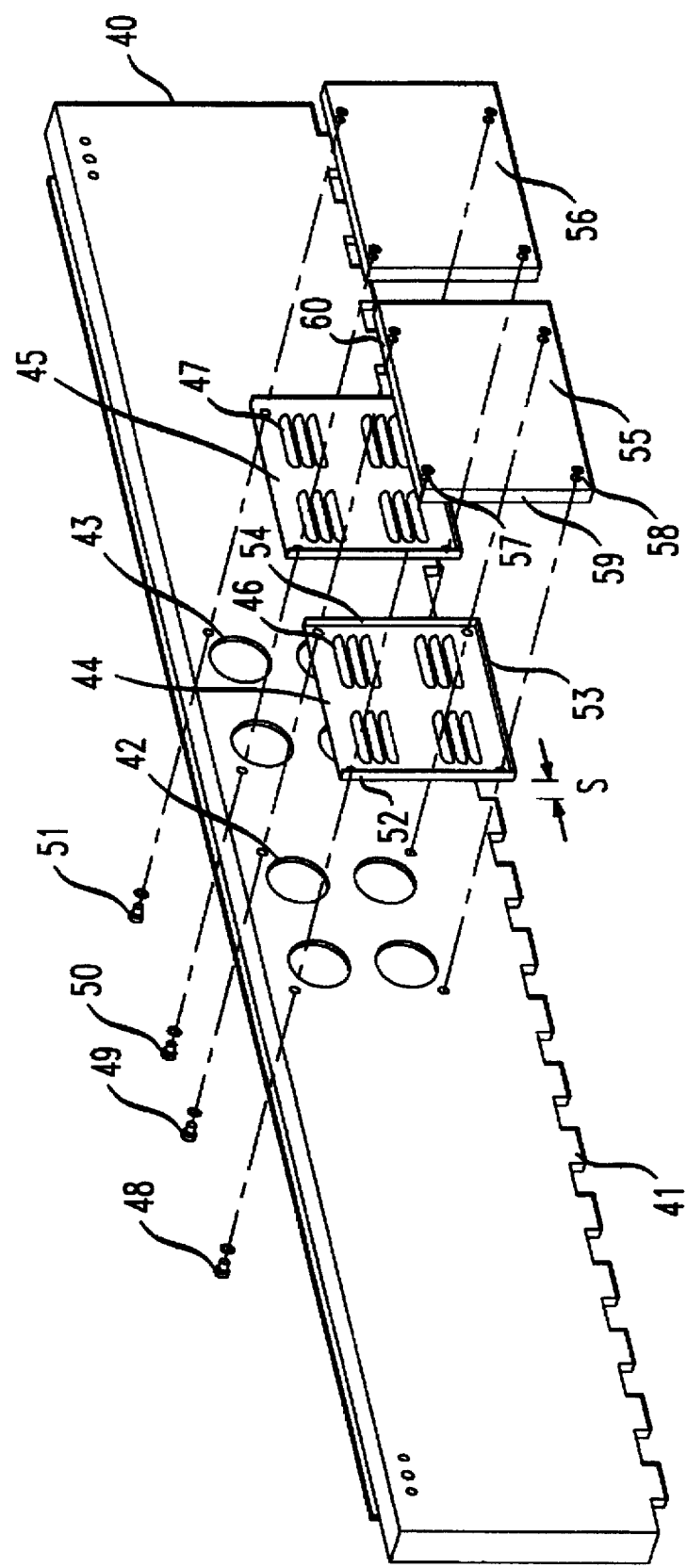
FIG. 2 is a perspective, exploded view of a compartment cover assembly for a cabinet in accordance with an embodiment of the invention.

FIG. 2 illustrates the structure used to cover the battery compartment, 30, in accordance with one embodiment. The structure includes a cover member, 40, which covers the entire opening of the compartment on one side. (An identical structure can be included on the opposite side of the compartment.) The cover member, 40, includes a plurality of tabs, e.g., 41, extending from the bottom surface. These tabs are inserted into slots, e.g., 32 of FIG. 1, in a strip, 33, at the bottom of the compartment, 30, in order to secure the cover member to the compartment. Returning to FIG. 2, the cover member also includes, in this example, two arrays of circular holes, e.g., 42 and 43, each array having four holes. Of course, the number of arrays and the number and shape of holes can be varied according to different needs.

Attached to the cover member, 40, over the area of each array is a separate plate, 44 and 45, each with an array of louvers, e.g., 46 and 47, formed in the major surfaces. The louvers in this example are arranged in sets of three, each set covering a hole, e.g., 42, in the cover member. The surfaces of the plates, 44 and 45, adjacent to the cover member, 40, are essentially flat so that the plates are mounted flush against the cover member by means of screws, e.g., 48–51. On the surface of each plate, e.g., 44, opposite to the cover member are flanges, 52–54, which extend from the bottom and two sides of the surface.

The plates, 44 and 45, in this example are rectangular and measure 28.3 cm wide by 24.5 cm long. Each louver, e.g., 46, is approximately 8.9 cm long and 1.6 cm high to permit venting of air from the compartment, 30 of FIG. 1, through the corresponding hole, 42, in the cover member. The plates are typically made of aluminum alloy.

Mounted over each louvered plate, 44 and 45, is a corresponding blocking plate, 55 and 56, respectively. (See also FIG. 5.) Each blocking plate is slightly larger than the corresponding louvered plate so that the blocking plate completely covers the louvered plate. In this example, the blocking plates, 55 and 56, each measure approximately 39.4 cm by 31.8 cm. The blocking plates are mounted to the cover member, 40, using the same screws, e.g., 48–51, which secure the louvered plates, 44 and 45, to the cover member. The screws extend into standoffs, e.g., 57 and 58, formed on the surfaces of the blocking plates which face the cover member in order to provide receptacles and also to maintain a gap, G, between the facing surfaces of the blocking plates and louvered plates. (See FIG. 5.)

Figure 5:
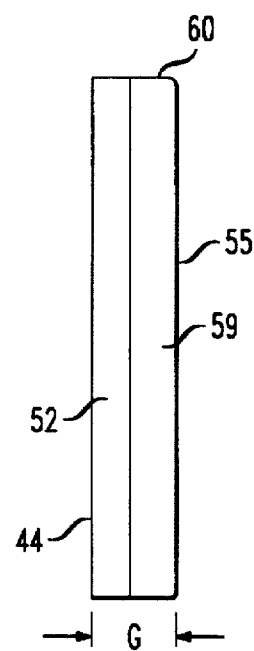
FIG. 5 is a side view of a portion of the assembly of FIG. 1.

It will be noted that each blocking plate, e.g., 55, has flanges extending from two sides, only one of which, 59, is visible in FIGS. 2 and 5. Further, a flange, e.g., 60, extends from the top of each blocking plate. All flanges extend toward the cover member, 40. The top flange, 60, is wider than the two side flanges, 59, the former measuring 2.8 cm in this example and the latter measuring 1.6 cm. Thus, the top flanges, e.g., 60, of the blocking plates, e.g., 55, contact the cover member, 40, to completely enclose the top of the louvered plates, e.g., 44, while the side flanges, e.g., 59, overlap the side flanges, e.g., 52, of the louvered plates.

Since the blocking plates, e.g., 55, are larger than the louvered plates, e.g., 44, there will also be a space, S, between the overlapping flanges, e.g., 52 and 59, in a direction parallel to the cover member, 40.

Figure 3:
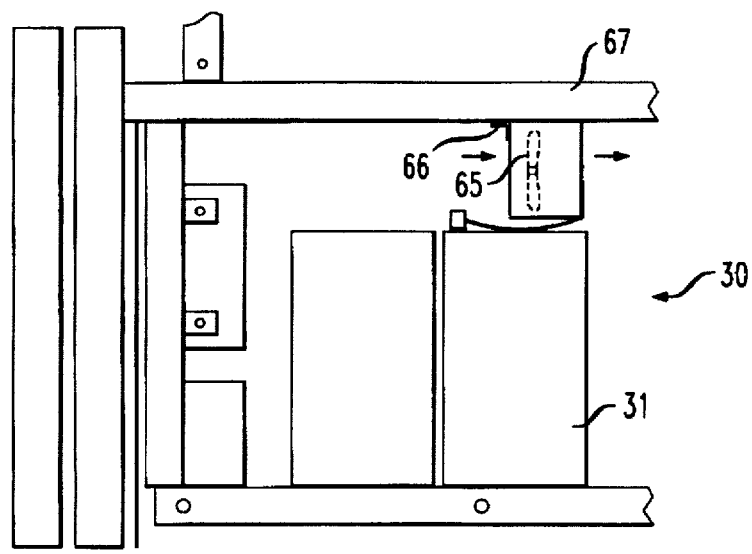
FIG. 3 is a front view of a portion of a compartment of the cabinet in accordance with the same embodiment.

FIG. 3 illustrates a portion of the battery compartment, 30, which includes a further feature of the invention. Specifically, a fan, 65, is shown mounted to a bracket, 66, which is attached to the top, 67, of the compartment, 30. The fan in this example is a commercially available fan sold by Papst under the designation Multifan 4218/12. The fan can be any of the standard types. The fan, 65, can be mounted near either the front or back of the compartment (the front being illustrated in FIG. 1), and on either end of the compartment. Desirably, the fan should be mounted so as to maximize internal circulation without drawing in or exhausting outside air. For example, the fan can be mounted so as to direct air flow, illustrated by the arrow, in a direction which is essentially parallel to the shield assemblies on the front and back of the compartment, 30. The direction of air flow may be important since, if air flow has a component which is directed at either the front or back of the compartment, a vacuum could be created at the opposite surface of the compartment which would tend to draw in moisture or contaminants from the environment, especially during hurricane conditions.

Thus, in operation, the circulation of the air created inside the compartment, 30, by the fan, 65, results in an increase in the venting capability of accumulated hydrogen through the holes, e.g., 42 and 43, in the cover member, 40, and through the corresponding sets of louvers, e.g. , 46 and 47, in the plates 44 and 45. The vented gas, therefore, is transmitted into the gap, G, between the louvered plates, 44 and 45, and the corresponding blocking plates, 55 and 56. The air in the gap then can mix with outside air and is diffused through the spaces, S, on the sides and on bottom of the plates. In the meantime, the blocking plates, 55 and 56, substantially prohibits rain or other wind driven particles from entering the louvers e.g., 46 and 47, during high winds (40 mph or more). Since the side flanges of the louvered and blocking plates, e.g., 52 and 59, respectively, overlap, wind blown particles are prevented from reaching the vents from an angle to the compartment while still permitting outside air to mix with the vented gas in the gap, G. The bottom and end flanges of the louvered plates, e.g., 52-54, also prevent water driven along the surface of the cover member, 40, from entering the vents. The top flange, e.g., 60, of the blocking plates prevents water from falling between the blocking plates and the louvered plates. It will be noted that the blocking plates, 55 and 56, do not include a bottom flange, since it was found that such a flange tended to create a nozzle effect allowing more water to reach the louvers in the event of high winds.

Figure 4:
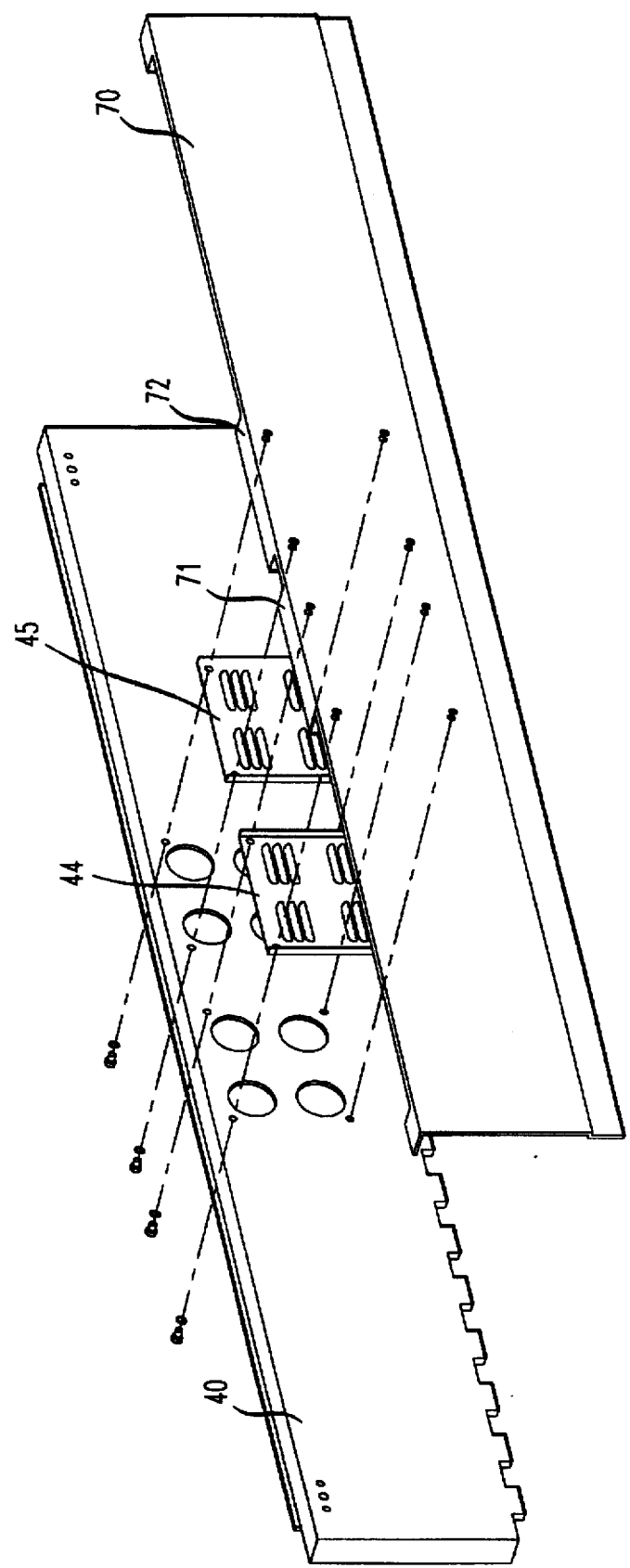
FIG. 4 is a perspective, exploded view of a compartment cover assembly in accordance with an alternative embodiment of the invention.

FIG. 4 shows an alternative embodiment where the individual blocking plates, 55 and 56, are replaced by a single blocking shield, 70, which extends the full length of the cover member, 40. Since the shield, 70, extends a significant distance beyond the louvered plates, 44 and 45, there is no need for the side flanges as in the previous embodiment. However, flanges, 71 and 72, are formed at the top of the shield, 70, at the portions which cover the louvered plates, 44 and 45, to protect the louvers against vertically falling rain as before. The shield, 70, is mounted in the same way as the blocking plates, 55 and 56, and consequently is not described in further detail.

Various additional modifications will become apparent to those skilled in the art. For example, the louvers may be formed in the cover member, 40, rather than in separate plates, 44 and 45. In that event, it would be desirable to also provide some form of flanges in the cover member to protect against moisture entering the louvers by traveling along the surface of the cover member.

The invention claimed is:

1. A cabinet for housing electronic equipment comprising:
   a battery compartment;
   a cover member covering the compartment and including a plurality of louvers on a portion thereof;
   a fan mounted in the compartment to circulate air therein; and
   a first substantially solid plate for substantially prohibiting wind driven particles from entering the louvers during high winds, said substantially solid plate being mounted over the portion of the cover member including the louvers and forming a gap between the plate and cover member.

2. The cabinet according to claim 1 wherein the louvers are formed in a second plate which is mounted to the cover member.

3. The cabinet according to claim 2 wherein the cover member includes a plurality of apertures opposite to the louvers in the second plate.

4. The cabinet according to claim 2 wherein the second plate includes flanges on two sides and a bottom edge of the second plate.

5. The cabinet according to claim 4 wherein the first plate includes flanges on two sides and a top portion of the first plate such that the flanges on the two sides of the first plate overlap the side flanges of the second plate and the top flange covers the top of the second plate.

6. The cabinet according to claim 1 wherein the first plate covers essentially the entire cover member.

7. The cabinet according to claim 1 wherein the fan circulates air in a direction which is essentially parallel with the cover member.

* * * * *